United States Patent
Kim et al.

(10) Patent No.: US 9,615,454 B2
(45) Date of Patent: Apr. 4, 2017

(54) TRANSPARENT CONDUCTOR, METHOD OF MANUFACTURING THE SAME, AND ELECTRONIC DEVICE INCLUDING THE TRANSPARENT CONDUCTOR

(71) Applicant: SAMSUNG ELECTRONICS CO., LTD., Suwon-si, Gyeonggi-do (KR)

(72) Inventors: Se Yun Kim, Seoul (KR); Eun Sung Lee, Hwaseong-si (KR); Keum Hwan Park, Seoul (KR); Weon Ho Shin, Busan (KR); Suk Jun Kim, Suwon-si (KR); Jin Man Park, Seoul (KR); Sang Soo Jee, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 383 days.

(21) Appl. No.: 14/095,005

(22) Filed: Dec. 3, 2013

(65) Prior Publication Data

US 2014/0345919 A1    Nov. 27, 2014

(30) Foreign Application Priority Data

May 23, 2013    (KR) ........................ 10-2013-0058515

(51) Int. Cl.
| | |
|---|---|
| H05K 1/02 | (2006.01) |
| H05K 1/09 | (2006.01) |
| H01B 1/02 | (2006.01) |
| H01B 1/16 | (2006.01) |
| H01L 31/0224 | (2006.01) |

(Continued)

(52) U.S. Cl.
CPC ................. *H05K 1/09* (2013.01); *H01B 1/16* (2013.01); *H01L 31/02167* (2013.01); *H01L 31/022466* (2013.01); *H05K 1/0289* (2013.01); *H05K 1/092* (2013.01); *H05K 3/101* (2013.01);

(Continued)

(58) Field of Classification Search
CPC ............. H05K 1/09; H05K 2201/0108; H05K 1/0289; H05K 1/092; H01L 31/022466; H01B 1/16; Y10T 428/24355; Y10T 428/24893

See application file for complete search history.

(56) References Cited

U.S. PATENT DOCUMENTS

| | | |
|---|---|---|
| 4,639,543 A | 1/1987 | Fang |
| 6,730,384 B2 | 5/2004 | Yamamoto et al. |

(Continued)

FOREIGN PATENT DOCUMENTS

| | | |
|---|---|---|
| JP | 11224953 A | 8/1999 |
| JP | 2006350205 A | 12/2006 |

OTHER PUBLICATIONS

Ellmer, K., "Past achievements and future challenges in the development of optically transparent electrodes", Nature Photonics, Dec. 2012, vol. 6, pp. 809-817.

(Continued)

*Primary Examiner* — Laura Auer
(74) *Attorney, Agent, or Firm* — Cantor Colburn LLP

(57) ABSTRACT

A transparent conductor includes a metallic glass, and a method of manufacturing a transparent conductor includes: preparing a metallic glass or a mixture comprising the metallic glass; and firing the metallic glass or the mixture comprising the metallic glass at a predetermined temperature higher than a glass transition temperature of the metallic glass.

12 Claims, 6 Drawing Sheets

(51) Int. Cl.
*H01L 31/0216* (2014.01)
*H05K 3/10* (2006.01)
*H05K 3/12* (2006.01)

(52) U.S. Cl.
CPC ......... *H05K 3/1216* (2013.01); *H05K 3/1275* (2013.01); *H05K 2201/0108* (2013.01); *Y02E 10/50* (2013.01)

(56) References Cited

U.S. PATENT DOCUMENTS

| | | | | |
|---|---|---|---|---|
| 2002/0187379 | A1* | 12/2002 | Yasuo | C23C 8/02 429/509 |
| 2003/0122110 | A1* | 7/2003 | Kelley | H01B 1/16 252/500 |
| 2007/0103055 | A1* | 5/2007 | Tomai | H01L 51/5206 313/503 |
| 2013/0037832 | A1 | 2/2013 | Kang | |
| 2013/0299214 | A1* | 11/2013 | Frey | H05K 9/0096 174/253 |

OTHER PUBLICATIONS

Kang, M.G., et al, "Organic Solar Cells Using Nanoimprinted Transparent Metal Electrodes", Advanced Materials, 2008. vol. 20, pp. 4408-4413.

* cited by examiner

TRANSPARENT CONDUCTOR, METHOD OF MANUFACTURING THE SAME, AND ELECTRONIC DEVICE INCLUDING THE TRANSPARENT CONDUCTOR

CROSS-REFERENCE TO RELATED APPLICATIONS

This application claims priority to Korean Patent Application No. 10-2013-0058515 filed on May 23, 2013, and all the benefits accruing therefrom under 35 U.S.C. §119, the content of which in its entirety is herein incorporated by reference.

BACKGROUND

1. Field

The disclosure relates to a transparent conductor, a method of manufacturing the transparent conductor, and an electronic device including the transparent conductor.

2. Description of the Related Art

An electronic device such as a liquid crystal display ("LCD") or an organic light emitting diode ("OLED") device includes a transparent conductor as a transparent electrode.

The transparent conductor may be broadly classified into three types according to a material included therein. The first type is an organic-based transparent conductor such as a conductive polymer, a carbon nanostructure or graphene, the second type is an oxide-based transparent conductor such as indium tin oxide ("ITO"); and the third type is a metal-based transparent conductor such as a metal grid.

However, the conductive polymer typically has high specific resistance and low transparency, and may be easily deteriorated when exposed to moisture and air, a cost for providing the carbon nanostructure is substantially high; and the graphene may not be efficiently formed as a large area transparent conductor. In addition, the manufacturing cost of the transparent conductor including ITO may be substantially high due to the high cost of indium, and a vacuum process is typically used to provide the metal grid, thereby increasing the manufacturing cost.

SUMMARY

Embodiments of the invention relate to a transparent conductor having a high specific resistance, a high transparency, a large area and manufactured with a reduced process cost, a method of manufacturing the transparent conductor, and an electronic device including the transparent conductor.

According to an embodiment, a transparent conductor includes a metallic glass.

In an embodiment, the transparent conductor may further include an oxide glass.

In an embodiment, the transparent conductor may include a matrix part including the oxide glass, and a conductive network part including the metallic glass, where the conductive network part defines a network in the matrix part.

In an embodiment, the conductive network part may have a width less than a wavelength in a visible ray wavelength. Referring to FIG. 1, the width of the conductive network part 12a may be defined as a distance between adjacent portions of the matrix part 11a, at which the conductive network part 12a is disposed.

In an embodiment, the conductive network part may have a width in a range of about 0.1 nanometer (nm) to about 780 nm.

In an embodiment, a content of the metallic glass in the transparent conductor may be less than a content of the oxide glass in the transparent conductor.

In an embodiment, the metallic glass in the transparent conductor may be in a range of about 0.1 volume % to about 15 volume % based on a total volume of the transparent conductor.

In an embodiment, the transparent conductor may include a metallic glass grid including the metallic glass.

In an embodiment, the metallic glass grid may include a plurality of first metallic glass wires which extends substantially in a first direction and a plurality of second metallic glass wires which extends substantially in a second direction crossing the first direction, and the first metallic glass wires and the second metallic glass wires may be connected to each other at a plurality of junctions.

In an embodiment, the metallic glass grid may be disposed on a surface of a substrate, and the metallic glass grid may have an area of less than or equal to about 15% of a total area of the surface of the transparent substrate.

In an embodiment, the metallic glass may include aluminum (Al), copper (Cu), zirconium (Zr), titanium (Ti), nickel (Ni), iron (Fe), gold (Au), magnesium (Mg), calcium (Ca), cerium (Ce), strontium (Sr), ytterbium (Yb), zinc (Zn), platinum (Pt), cobalt (Co), palladium (Pd), cerium (Ce), lanthanum (La), yttrium (Y), gadolinium (Gd), beryllium (Be), tantalum (Ta), gallium (Ga), hafnium (Hf), niobium (Nb), lead (Pb), platinum (Pt), silver (Ag), phosphorus (P), boron (B), silicon (Si), carbon (C), tin (Sn), zinc (Zn), lithium (Li), molybdenum (Mo), tungsten (W), manganese (Mn), erbium (Er), chromium (Cr), praseodymium (Pr), thulium (Tm), or a combination thereof.

In an embodiment, a transmittance of the transparent conductor may be greater than or equal to about 85% and a specific resistance of the transparent conductor may be less than or equal to about $10^{-3}$ ohm centimeter (Ωcm).

According to another embodiment, a method of manufacturing a transparent conductor includes: preparing a metallic glass or a mixture including the metallic glass; and firing the metallic glass or the mixture including the metallic glass at a predetermined temperature higher than a glass transition temperature of the metallic glass.

In an embodiment, the mixture including the metallic glass may further include an oxide glass.

In an embodiment, the preparing the metallic glass or the mixture including the metallic glass may include applying the metallic glass or the mixture including the metallic glass using an inkjet printing or a screen printing method.

In an embodiment, the predetermined temperature may be in a range of about 50° C. to about 800° C.

In an embodiment, the preparing the metallic glass or the mixture including the metallic glass may include applying the metallic glass or the mixture including the metallic glass by an imprinting method.

In an embodiment, the preparing the metallic glass or the mixture including the metallic glass may include: preparing a metallic glass sheet including the metallic glass; and imprinting the metallic glass sheet by a stamp.

In an embodiment, the preparing the metallic glass or the mixture including the metallic glass may include: applying a paste including the metallic glass; and imprinting the applied paste by a stamp.

According to another embodiment, an electronic device includes a transparent conductor including a metallic glass.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
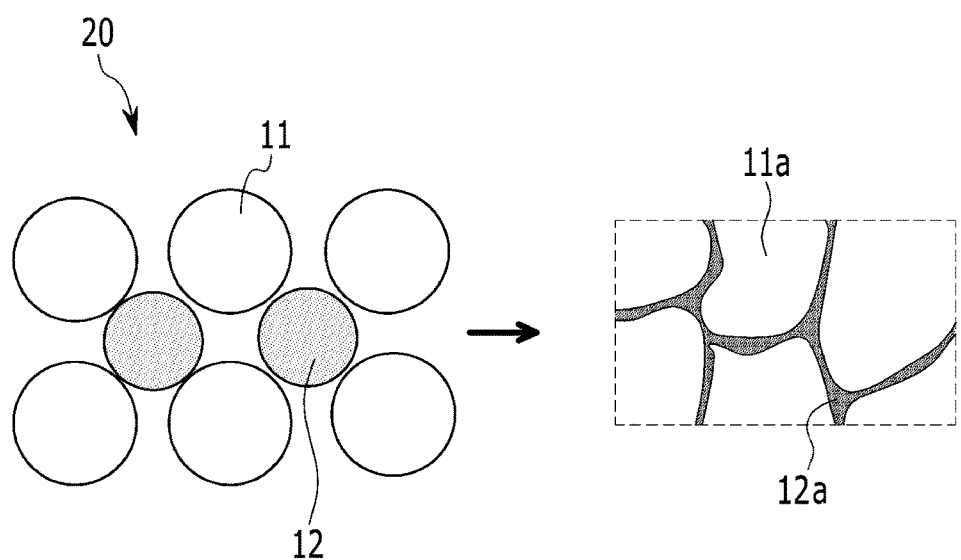
FIG. 1 is a schematic view showing an embodiment of a transparent conductor according to the invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Herein, the term "element" may refer to a metal or a semi-metal.

Hereinafter, an embodiment of a transparent conductor according to the invention will be described in detail.

An embodiment of a transparent conductor includes a metallic glass.

In such an embodiment, the metallic glass may include an alloy having a disordered atomic structure including a plurality of elements. The metallic glass may also be referred to as an amorphous metal. The metallic glass includes an amorphous part that is formed by quenching a plurality of elements.

The amorphous part of the metallic glass may be in a range of about 50 volume percent (volume %) to about 100 volume % of the metallic glass, e.g., in a range of about 70 volume % to about 100 volume %, or in a range of about 90 volume % to about 100 volume %.

The metallic glass may maintain the amorphous part formed when having been a liquid phase at a high temperature as it is, even at room temperature. Accordingly, the metallic glass has a different structure from the crystalline structure of a general alloy having a regular arrangement of elements, and is also different from the structure of liquid metals present in a liquid phase at room temperature. The metallic glass has substantially low resistivity or substantially high conductivity, e.g., lower resistivity or higher conductivity than a glass such as a silicate.

The metallic glass may include an alloy of a transition metal, a noble metal, a rare earth element, an alkaline-earth metal, a semi-metal, or a combination thereof. In one embodiment, for example, the metallic glass may include aluminum (Al), copper (Cu), zirconium (Zr), titanium (Ti), nickel (Ni), iron (Fe), gold (Au), magnesium (Mg), calcium (Ca), cerium (Ce), strontium (Sr), ytterbium (Yb), zinc (Zn), platinum (Pt), cobalt (Co), palladium (Pd), cerium (Ce), lanthanum (La), yttrium (Y), gadolinium (Gd), beryllium (Be), tantalum (Ta), gallium (Ga), hafnium (Hf), niobium (Nb), lead (Pb), platinum (Pt), silver (Ag), phosphorus (P), boron (B), silicon (Si), carbon (C), tin (Sn), zinc (Zn), lithium (Li), molybdenum (Mo), tungsten (W), manganese (Mn), erbium (Er), chromium (Cr), praseodymium (Pr), thulium (Tm), or a combination thereof.

In one embodiment, for example, the metallic glass may be aluminum-based metallic glass, copper-based metallic glass, zirconium-based metallic glass, titanium-based metallic glass, nickel-based metallic glass, iron-based metallic glass, cerium-based metallic glass, strontium-based metallic glass, gold-based metallic glass, ytterbium-based metallic glass, zinc-based metallic glass, calcium-based metallic glass, magnesium-based metallic glass, or platinum-based metallic glass, but is not limited thereto.

The aluminum-based metallic glass, copper-based metallic glass, zirconium-based metallic glass, titanium-based metallic glass, nickel-based metallic glass, iron-based metallic glass, cerium-based metallic glass, strontium-based metallic glass, gold-based metallic glass, ytterbium-based metallic glass, zinc-based metallic glass, calcium-based metallic glass, magnesium-based metallic glass and platinum-based metallic glass may be alloy including aluminum, copper, zirconium, titanium, nickel, iron, cerium, strontium, gold, ytterbium, zinc, calcium, magnesium and platinum, respectively, as a main component, and may include, for example, nickel (Ni), yttrium (Y), cobalt (Co), lanthanum (La), zirconium (Zr), iron (Fe), titanium (Ti), calcium (Ca), beryllium (Be), magnesium (Mg), sodium (Na), molybdenum (Mo), tungsten (W), tin (Sn), zinc (Zn), potassium (K), lithium (Li), phosphorus (P), palladium (Pd), platinum (Pt), rubidium (Rb), chromium (Cr), strontium (Sr), cerium (Ce), praseodymium (Pr), promethium (Pm), samarium (Sm), lutetium (Lu), neodymium (Nd), niobium (Nb), gadolinium (Gd), terbium (Tb), dysprosium (Dy), holmium (Ho), erbium (Er), thulium (Tm), thulium (Th), scandium (Sc), barium (Ba), ytterbium (Yb), europium (Eu), hafnium (Hf), arsenic (As), plutonium (Pu), gallium (Ga), germanium (Ge), antimony (Sb), silicon (Si), cadmium (Cd), indium (In), platinum (Pt), manganese (Mn), niobium (Nb), osmium (Os), vanadium (V), aluminum (Al), copper (Cu), silver (Ag), or mercury (Hg). Herein, the main component is defined as a component the highest mole ratio among the components of the metallic glass.

The metallic glass is softened at more than or equal to a glass transition temperature (also referred to as "Tg"), where it may have a liquid-like behavior. The liquid-like characteristics is maintained between the glass transition temperature (Tg) and a crystalline temperature (also referred to as "Tx") of the metallic glass, which is called a supercooled liquid region (also referred to as "ΔTx").

In an embodiment, the metallic glass may have a glass transition temperature (Tg) of less than or equal to, for example, about 800° C., for example, a temperature in a range of about 50° C. to about 800° C. In an embodiment, the metallic glass may have a supercooled liquid region (ΔTx) of about zero (0) kelvin (K) to about 200 K.

In an embodiment, the metallic glass may have a specific resistance in a predetermined range of, for example, less than or equal to about 500 microohm centimeter (μΩcm) after crystallization, and the metallic glass may be effectively used as a conductor by having the specific resistance in the predetermine range. In one embodiment, for example, the specific resistance may be less than or equal to about 150 μΩcm.

The following Table 1 shows some exemplary embodiments of the metallic glass included in the transparent conductor, but the invention is not limited thereto.

TABLE 1

| Composition | Tg (° C.) | Tx (° C.) | Specific resistance after crystallization (μΩcm) |
|---|---|---|---|
| $Al_{86}Ni_6Y_{4.5}Co_2La_{1.5}$ | 250 | 261 | 21 |
| $Al_{84.5}Ni_{5.5}Y_{10}$ | 207 | 244 | 12 |
| $Al_{86}La_5Ni_9$ | 234 | 249 | 14 |
| $Al_{86}La_6Ni_8$ | 257 | 269 | 17 |
| $Al_{85}La_6Ni_9$ | 256 | 272 | 15 |
| $Al_{85}La_5Ni_{10}$ | 243 | 260 | 19 |
| $Ti_{50}Cu_{50}$ | 403 | 449 | 77 |
| $Ti_{50}Cu_{35}Ni_{15}$ | 430 | 464 | 126 |
| $Ti_{50}Cu_{32}Ni_{15}Sn_3$ | 431 | 473 | 119 |
| $Ti_{50}Cu_{30}Ni_{15}Sn_5$ | 439 | 475 | 142 |
| $Ti_{50}Cu_{25}Ni_{15}Sn_5Zr_5$ | 431 | 481 | 123 |
| $Ti_{50}Cu_{42.5}Ni_{7.5}$ | 420 | 447 | 77 |
| $Ti_{47.5}Cu_{42.5}Ni_{7.5}Zr_{2.5}$ | 407 | 440 | 63 |
| $Ti_{45}Cu_{40}Ni_5Sn_5Zr_5$ | 436 | 480 | 145 |
| $Zr_{48}Cu_{28}Al_8Ag_8Ni_8$ | 447 | 508 | 137 |
| $Zr_{70}Cu_{30}$ | 335 | 389 | 85 |
| $Cu_{50}Zr_{50}$ | 424 | 465 | 167 |
| $Cu_{46}Zr_{46}Al_8$ | 455 | 518 | 161 |
| $Cu_{58.1}Zr_{35.9}Al_6$ | 491 | 532 | 192 |
| $Cu_{45}Zr_{45}Ag_{10}$ | 420 | 479 | 167 |
| $Cu_{43}Zr_{43}Al_7Ag_7$ | 454 | 515 | 186 |
| $Zr_{48}Cu_{34}Al_8Ag_8Ni_2$ | 445 | 533 | 456 |
| $Zr_{50.7}Cu_{28}Al_{12.3}Ni_9$ | 453 | 526 | 251 |
| $Zr_{53}Cu_{18.7}Al_{16.3}Ni_{12}$ | 466 | 547 | 242 |
| $Ni_{55}Zr_{34}Al_{11}$ | 562 | 580 | 213 |
| $Ni_{57.5}Zr_{35}Al_{7.5}$ | 550 | 575 | 206 |
| $Ni_{45}Zr_{25}Ti_{20}Al_{10}$ | 500 | 545 | 194 |

In one embodiment, for example, the transparent conductor may further include an oxide glass.

In such an embodiment, the oxide glass, which is an oxide of a metal, a semi-metal, and/or a non-metal, is a material having high transparency. In an embodiment, the oxide glass may include silicate, borate, phosphate, zinc salt, barium salt, or sodium salt, for example. In one embodiment, for example, the oxide glass may be PbO, $SiO_2$, $B_2O_3$, ZnO, BaO, $P_2O_5$, $Na_2O$, PbO—$SiO_2$-based, PbO—$SiO_2$—$B_2O_3$-based, PbO—$SiO_2$—$B_2O_3$—ZnO-based, PbO—$SiO_2$—$B_2O_3$—BaO-based, PbO—$SiO_2$—ZnO—BaO-based, ZnO—$SiO_2$-based, ZnO—$B_2O_3$—$SiO_2$-based, ZnO—$K_2O$—$B_2O_3$—$SiO_2$—BaO-based, $Bi_2O_3$—$SiO_2$-based, $Bi_2O_3$—$B_2O_3$—$SiO_2$-based, $Bi_2O_3$—$B_2O_3$—$SiO_2$—BaO-based, ZnO—BaO—$B_2O_3$—$P_2O_5$—$Na_2O$-based, or $Bi_2O_3$—$B_2O_3$—$SiO_2$—BaO—ZnO-based oxide glass, or a combination thereof, but the invention is not limited thereto.

The oxide glass is softened at a temperature higher than or equal to about a glass transition temperature (Tg), where the oxide glass may have a liquid-like behavior, like the metallic glass. The oxide glass may have a glass transition temperature (Tg) of less than or equal to about 800° C. In one embodiment, for example, the oxide glass may have a glass transition temperature (Tg) in a range of about 50 to about 800° C.

In an embodiment, a transparent conductor having high transparency and conductivity may be prepared by softening and firing the metallic glass and the oxide glass, e.g., by firing a mixture of the metallic glass and the oxide glass at a temperature of greater than or equal to the glass transition temperatures (Tg) thereof.

FIG. 1 is a schematic view showing an embodiment of a transparent conductor according to the invention.

Referring to FIG. 1, an embodiment of a transparent conductor 20 includes a matrix part 11a including an oxide glass 11 and a conductive network part 12a including a metallic glass. In such an embodiment, a transparent conductor 20 including a matrix part 11a including oxide glass 11 having a fired structure, and a conductive network part 12a including metallic glass having a fired structure may be provided by mixing and firing an oxide glass 11 powder and a metallic glass 12 at a temperature greater than or equal to the glass transition temperature (Tg).

In such an embodiment, the matrix part 11a including the fired part of oxide glass 11 may have high transparency, and the conductive network part 12a including the fired part of the metallic glass 12 may allow the transparent conductor 20 to have high conductivity by connecting between matrix parts 11a in a network.

In an embodiment, the conductive network part 12a may have a smaller width than a wavelength in the visible ray wavelength region. When the visible ray wavelength region ranges from about 400 nanometers (nm) to about 780 nm, the conductive network part 12a may have a width in a range of about 0.1 nm to about 780 nm. In one embodiment, for example, the conductive network part 12a has a width in a range of about 0.1 nm to about 100 nm. In such an embodiment, where the conductive network part 12a may have a width smaller than a wavelength in the visible ray wavelength region, the conductive network part 12a may have substantially high transparency, such that the transparency of the transparent conductor 20 may be further increased.

In such an embodiment, the contents of the oxide glass 11 and the metallic glass 12 may be predetermined to satisfy both transparency and conductivity. In one embodiment, for example, considering the specific resistance of the oxide glass 11, the specific resistance of the metallic glass 12 and an area of the oxide glass 11 and the metallic glass 12, the contents of the oxide glass 11 and the metallic glass 12 may be calculated according to the following Equation 1.

$$\frac{A}{\rho} = \frac{A_1}{\rho_1} + \frac{A_2}{\rho_2} \quad \text{Equation 1}$$

In Equation 1, $\rho$ denotes specific resistance of a transparent conductor including a conductive network part including a metallic glass and a matrix part including an oxide glass, $\rho_1$ denotes specific resistance of oxide glass, $\rho_2$ denotes specific resistance of the metallic glass, A denotes a total cross-sectional area of the transparent conductor, $A_1$ denotes a cross-section area of the matrix part including the oxide glass, and $A_2$ denotes a cross-sectional area of the conductive network part including the metallic glass.

In an embodiment, the transparency of the transparent conductor may be decreased substantially in proportion to the area of the conductive network part, the contents of the oxide glass 11 and the metallic glass 12 may be determined by, for example, the following Equation 2.

$$\frac{100}{\rho} = \frac{(100-x)}{\rho_1} + \frac{x}{\rho_2} \quad \text{Equation 2}$$

In Equation 2, $\rho$ denotes specific resistance of the transparent conductor, $\rho_1$ denotes s specific resistance of the oxide glass, $\rho_2$ denotes specific resistance of the metallic glass, and x denotes a volume fraction of the metallic glass in the transparent conductor.

In one embodiment, for example, the contents of the oxide glass and the metallic glass may be determined using Equations 1 and 2, based on transparency and specific resistance of the transparent conductor predetermined for an object that the transparent conductor is used for.

In one embodiment, for example, the transparent conductor may include a smaller amount of the metallic glass than the amount of the oxide glass such that the transparent conductor may have substantially high transparency to be used, thereby functioning as a transparent electrode. In one embodiment, for example, the metallic glass may be included in a range of about 0.1 volume % to about 50 volume % based on the total volume of the transparent conductor. In one embodiment, for example, the metallic glass may be included at, for example, about 0.1 to about 15 volume % based on the total volume of the transparent conductor. In such an embodiment, the transparent conductor may have high transparency and high conductivity.

According to another embodiment, the transparent conductor may include a metallic glass grid.

The metallic glass grid may have a lattice pattern including metallic glass. In one embodiment, for example, the metallic glass grid may include a plurality of metallic glass wires elongated substantially in a first direction and a plurality of metallic glass wires elongated in a second direction crossing the first direction.

Figure 2:
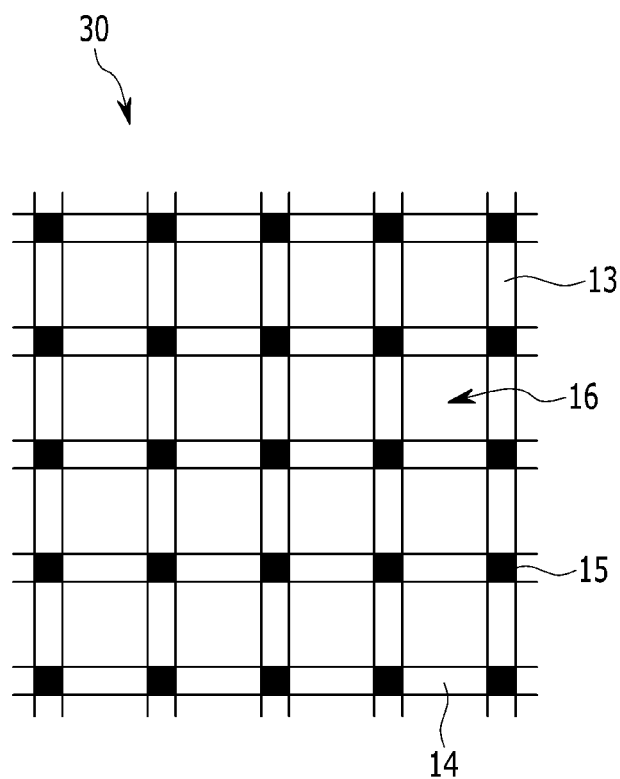
FIG. 2 is a schematic view showing an alternative embodiment of a transparent conductor according to the invention.

FIG. 2 is a schematic view showing an alternative embodiment of a transparent conductor according to the invention.

Referring to FIG. 2, the metallic glass grid 30 includes a plurality of first metallic glass wires 13 elongated substantially in a first direction and a plurality of second metallic glass wires 14 elongated substantially in a second direction, and further includes a plurality of junctions 15 disposed at the crossing point of the first metallic glass wires 13 and the second metallic glass wires 14. In such an embodiment, the first metallic glass wires 13 and the second metallic glass wires 14 are connected to each other by the junctions 15.

The first metallic glass wire 13 and the second metallic glass wire 14 may have a width in a range of about 1 nm to about 100 micrometers (μm). In one embodiment, for example, the first metallic glass wire 13 and the second metallic glass wire 14 may have a width in a range of about 10 nm to about 10 μm. In such an embodiment, the width of the metallic glass wire may be defined as a length of the metallic glass wire in a direction perpendicular to an extending direction of the metallic glass wire.

In an embodiment, the junction 15 may be defined as a part where the first metallic glass wire 13 and the second metallic glass wire 14 are connected. In such an embodiment, the junction 15 may be provided by firing the first and second metallic glass wires 13 and 14 disposed to cross each other at a temperature of greater than or equal to the glass transition temperature (Tg) of metallic glass. In such an embodiment, the junction 15 may increase the sinterability while having a liquid-like behavior in the supercooled liquid region of junction metallic glass. Accordingly, in such an embodiment, the connectivity of the first metallic glass wire 13 and the second metallic glass wire 14 may be increased, such that the conductivity of the metallic glass grid 30 may be improved.

In an embodiment, an opening region 16 that is defined by the first metallic glass wire 13 and the second metallic glass wire 14 is an empty space for transmitting light. In one embodiment, for example, light is transmitted through the opening region 16.

Figure 3:
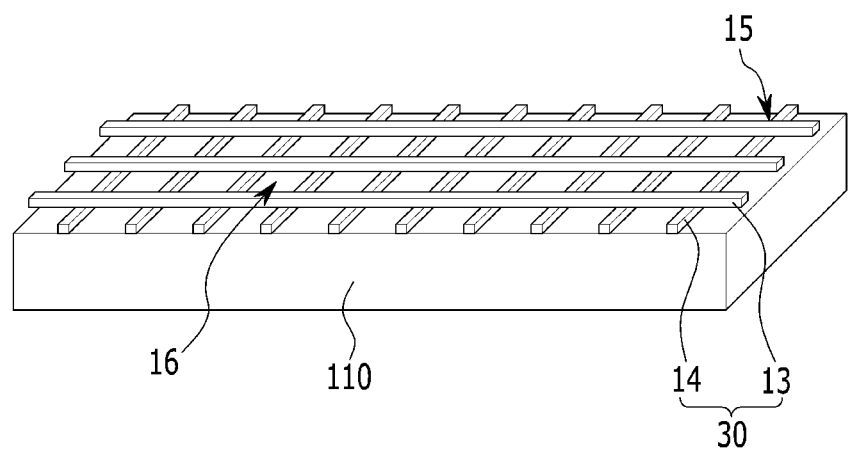
FIG. 3 is a schematic view showing another alternative embodiment of a transparent conductor according to the invention.

FIG. 3 is a schematic view showing another alternative embodiment of a transparent conductor according to the invention.

Referring to FIG. 3, an embodiment of the transparent conductor includes a metallic glass grid 30 disposed on a surface of a substrate 110, which may be transparent, and the metallic glass grid 30 includes a first metallic glass wire 13, a second metallic glass wire 14 and a junction 15 as described above with reference to FIG. 2.

In an embodiment, the metallic glass grid 30 may have a micro-pattern of a lattice, such that the transparent conductor may have high conductivity. In such an embodiment, an opening region 16, which exposes the substrate 110, is defined by the metallic glass grid 30 on the surface of the substrate 110, which is transparent, such that the transparent conductor may have high transparency.

In an embodiment, the area of metallic glass grid 30 may be less than or equal to about 30% based on the total area of the surface of the substrate 110. In one embodiment, for example, the area of metallic glass grid 30 may be less than or equal to about 15% based on the total area of the surface of the substrate 110. In such an embodiment, the transparent conductor may have high transparency.

In an embodiment, the transparent conductor may have a transmittance of greater than or equal to about 85% at a wavelength in the visible ray range, and have a specific resistance of less than or equal to about $10^{-3}$ ohm centimeter ($\Omega$cm). In one embodiment, for example, the transparent conductor may have a transmittance in a range of about 85% to about 99.9%, and a specific resistance in a range of about $10^{-4}$ $\Omega$cm to about $10^{-3}$ $\Omega$cm.

The transparent conductor may have a substantially high specific resistance and a substantially high transparency as described above, and a method of manufacturing the transparent conductor may be performed under an air atmosphere, such the manufacturing cost may be reduced. In such an embodiment, the transparent conductor may be effectively provided to have a large area, and may be provided without using an expensive material such as indium (In) or indium tin oxide ("ITO"), such that the manufacturing cost is substantially reduced.

Hereinafter, an embodiment of a method of manufacturing the transparent conductor will be described.

An embodiment of the method of manufacturing a transparent conductor includes preparing a metallic glass or a mixture including the metallic glass, and firing the metallic glass or the mixture including the metallic glass at a higher temperature than the glass transition temperature of the metallic glass.

First, an embodiment of a method of manufacturing a transparent conductor including the metallic glass and the oxide glass will be described.

Figure 4:
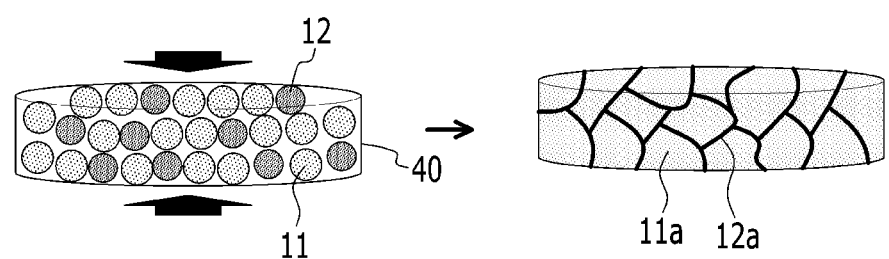
FIG. 4 is a schematic view showing an embodiment of a method of manufacturing a transparent conductor according to the invention.

FIG. 4 is a schematic view showing an embodiment of a method of manufacturing a transparent conductor according to the invention.

Referring to FIG. 4, in an embodiment of the method of manufacturing the transparent conductor, an oxide glass 11 and a metallic glass 12 are input into a mold 40 and fired at a high temperature while pressing the oxide glass 11 and the metallic glass 12 in a single direction or a plurality of directions with a predetermined pressure. In such an embodiment, the high temperature firing may be performed under an air atmosphere, for example, at a pressure in a range of about zero (0) megapascal (MPa) to about 2000 MPa, and at a temperature in a range of about 50° C. to about 800° C.

In such an embodiment, the oxide glass 11 and the metallic glass 12 may each be softened in the supercooled liquid region by the firing at the high temperature, and the softened metallic glass 12 and the softened oxide glass are disposed substantially close to, e.g., contact, each other, thereby providing a transparent conductor 20 including a matrix part 11$a$ including the oxide glass 11 having a fired structure, and a conductive network part 12$a$ including the metallic glass having a fired structure.

Figure 5A:
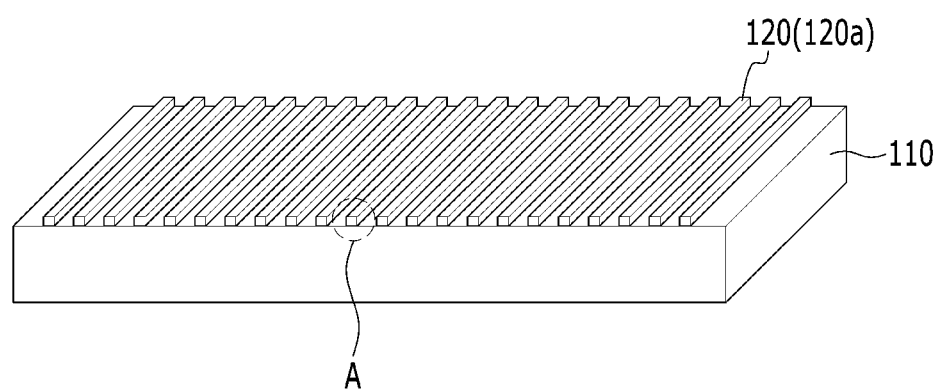
FIGS. 5A and 5B are schematic views showing an alternative embodiment of a method of manufacturing a transparent conductor according to the invention.
Figure 5B:
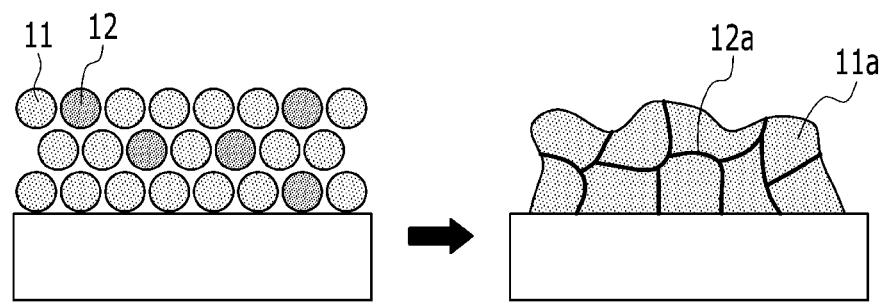

FIGS. 5A and 5B are schematic views showing an alternative embodiment of a method of manufacturing a transparent conductor according to the invention.

FIGS. 5A and 5B show one embodiment in which a transparent conductor is applied on a substrate as an electrode.

FIG. 5A is a perspective view of an embodiment of the transparent conductor on the substrate, and FIG. 5B is an enlarged side view of the portion A in FIG. 5A.

Referring to FIG. 5A, in such an embodiment, a conductive paste 120$a$ is applied in a predetermined pattern on a substrate 110. The conductive paste 120$a$ may be applied by, for example, inkjet printing or screen printing, but the invention is not limited thereto.

In such an embodiment, the conductive paste 120$a$ may include an oxide glass 11, a metallic glass 12 and an organic vehicle.

The oxide glass 11 and the metallic glass 12 may be substantially the same as the oxide glass 11 and the metallic glass 12 of the embodiments described above.

The organic vehicle may include an organic compound mixed with the oxide glass 11 and the metallic glass 12 that imparts viscosity to the organic vehicle, and a solvent that dissolves the above components, e.g., the organic compound mixed with the oxide glass 11 and the metallic glass 12.

The organic compound may include a (meth)acrylate-based resin, a cellulose resin (e.g., ethyl cellulose), a phenol resin, an alcohol resin, tetrafluoroethylene (e.g., TEFLON®), or a combination thereof, for example, and may further include an additive such as a dispersing agent, a surfactant, a thickener, and a stabilizer, for example.

The solvent may be any solvent that dissolves the above components. In one embodiment, for example, the solvent may include terpineol, butylcarbitol, butylcarbitol acetate, pentanediol, dipentyne, limonene, ethylene glycol alkylether, diethylene glycol alkylether, ethylene glycol alkylether acetate, diethylene glycol alkylether acetate, diethylene glycol dialkylether acetate, triethylene glycol alkylether acetate, triethylene glycol alkylether, propylene glycol alkylether, propylene glycol phenylether, dipropylene glycol alkylether, tripropylene glycol alkylether, propylene glycol alkylether acetate, dipropylene glycol alkylether acetate, tripropylene glycol alkyl ether acetate, dimethylphthalic acid, diethylphthalic acid, dibutylphthalic acid, desalted water, or a combination thereof.

In an embodiment, the conductive paste including the oxide glass 11, the metallic glass 12 and the organic vehicle is provided on, e.g., applied onto, the substrate 110 and fired at a predetermined temperature higher than the glass transition temperature (Tg) of the oxide glass 11 and the metallic glass 12 to provide a transparent electrode 120 including a matrix part 11a including the oxide glass 11 having a fired structure and a conductive network part 12a including the metallic glass 12 having a fired structure.

Hereinafter, embodiments of a method of manufacturing a transparent conductor including a metallic glass grid will be described.

Figure 6:
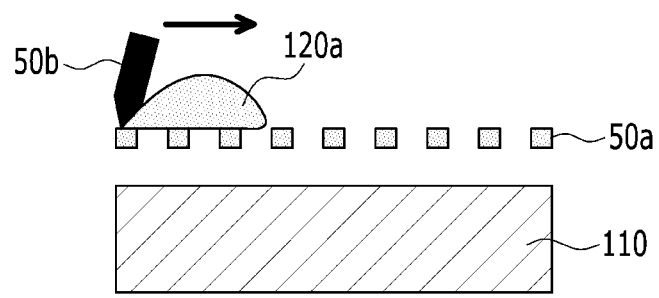
FIG. 6 to FIG. 8 are schematic views showing other alternative embodiments of a method of manufacturing a transparent conductor according to the invention.
Figure 7:
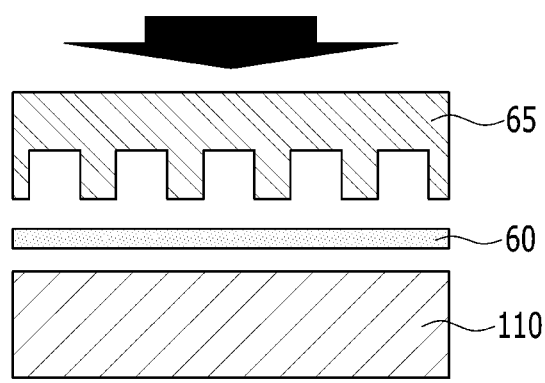
Figure 8:
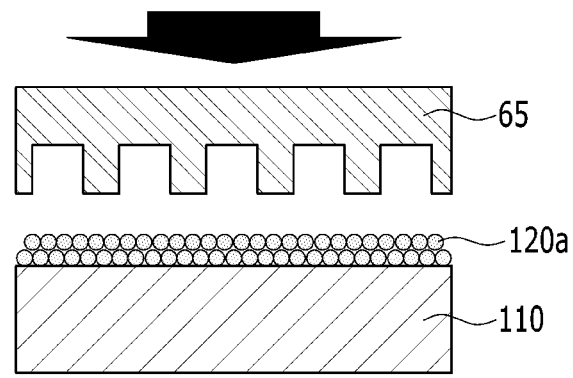

FIG. 6 to FIG. 8 are schematic views showing various embodiments of a method of manufacturing a transparent conductor according to the invention.

FIG. 6 to FIG. 8 show embodiments of a method of providing a metallic glass grid on the substrate as a transparent electrode.

Referring to FIG. 6, in an embodiment, the metallic glass grid may be provided on the substrate using a conductive paste 120a. In one embodiment, for example, a screen plate 50a in which a predetermined pattern including a plurality of openings are defined, may be disposed on a substrate 110, and the conductive paste 120a may be pushed out through the screen plate 50a using a squeegee 50b according to a screen printing method to provide a metal glass grid having a predetermined pattern. In an alternative embodiment, the metallic glass grid having the predetermined pattern may be provided by an inkjet printing method.

In such an embodiment, the conductive paste 120a may include a metallic glass and an organic vehicle, and may further include a metallic powder. The metallic glass and the organic vehicle are substantially the same as the metallic glass and the organic vehicle of the embodiments described above, and the metallic powder may include a low-resistance metal such as silver (Ag), copper (Cu), aluminum (Al) or an alloy thereof, for example, and may improve the conductivity of the metallic glass grid 30.

Subsequently, the metallic glass grid 30 including the metallic glass having a fired structure may be provided by firing at a predetermined temperature higher than the glass transition temperature (Tg) of the metallic glass 12, for example, at a temperature in an range of about 50° C. to about 800° C.

Referring to FIG. 7, in an alternative embodiment, the metallic glass grid may be provided on the substrate using a metallic glass sheet 60 including a metallic glass. In such an embodiment, the metallic glass sheet 60 may be disposed on the substrate 110 and imprinted thereon using a stamp 65 to provide the metallic glass grid having a predetermined pattern. The stamp 65 has a plurality of convex and/or concave parts, and the convex and/or concave parts may be arranged in a pattern corresponding to the predetermined pattern of a metallic glass grid such as a lattice pattern, for example.

Subsequently, by firing at a predetermined temperature higher than the glass transition temperature (Tg) of the metallic glass in the metallic glass sheet 60, for example, at a temperature in a range of about 50° C. to about 800° C., only part of metallic glass sheet 60 where it is imprinted may closely contact the substrate 110, thereby providing a metallic glass grid 30 including a metallic glass having a fired structure.

Referring to FIG. 8, in an embodiment, the metallic glass grid may be provided on the substrate using a conductive paste 120a including a metallic glass. In such an embodiment, the conductive paste 120a is applied on the substrate 110 and imprinted thereon using a stamp 65 to provide the metallic glass grid having a predetermined pattern. The conductive paste 120a may be applied on the substrate 110 by, for example, spin coating, slit coating, inkjet printing, and/or screen printing.

In such an embodiment, the conductive paste 120a may include a metallic glass and an organic vehicle, and may further include a metallic powder. The metallic glass and the organic vehicle are substantially the same as metallic glass and the organic vehicle of the embodiments described above, and the metallic powder may include a low resistance metal and may improve the conductivity of the metallic glass grid 30. The imprinting stamp 65 may have a plurality of concave and convex parts defined on a surface thereof, and the concave and convex parts may be arranged in a pattern corresponding to the predetermined pattern of a metallic glass grid such as a lattice pattern, for example.

Subsequently, by firing at a predetermined temperature higher than the glass transition temperature (Tg) of the metallic glass included in the conductive paste 120a, for example, at a temperature in a range of about 50° C. to about 800° C., only the imprinted part in the conductive paste 120a closely contacts the substrate 110, thereby providing a metallic glass grid 30 including a metallic glass having a fired structure.

Embodiments of a method of providing the transparent conductor are described above, but the invention is not limited thereto, and the transparent conductor may be provided using various methods.

The transparent conductor may be applied for any object that includes a conductor having high transparency and high conductivity, and for example, may be applied to an electrode for an electronic device.

The electronic device may include, for example a liquid crystal display ("LCD"), an organic light emitting diode ("OLED") device, a plasma display panel, a solar cell, and the like, but the invention is not limited thereto.

Hereinafter, an embodiment of a solar cell including the transparent conductor will be described with reference to FIG. 9.

Figure 9:
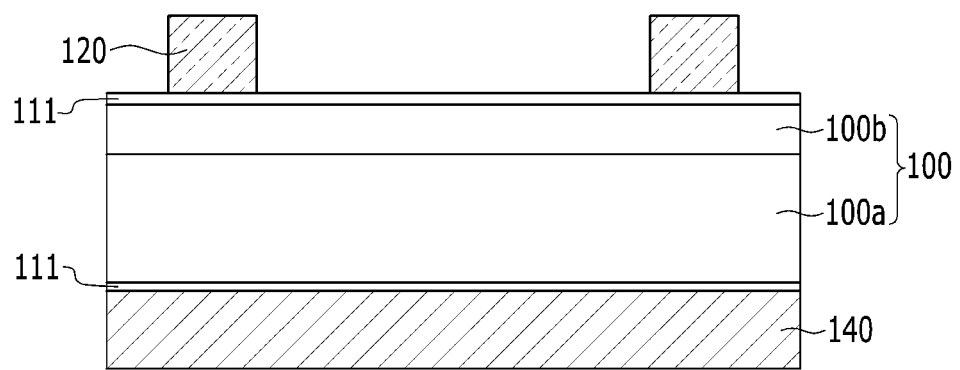
FIG. 9 is a cross-sectional view showing an embodiment of a solar cell according to the invention.

In FIG. 9, opposing sides of a semiconductor substrate 100 are illustrated to be disposed on top and bottom portions, respectively, for better understanding and convenience of description, but top and bottom portions of the semiconductor substrate may be different sides thereof when viewed in a different view. In addition, a side of the semiconductor substrate that receives solar energy may be referred to as a front side, and the other opposite side of the semiconductor substrate may be referred to as a rear side.

FIG. 9 is a cross-sectional view of an embodiment of a solar cell according to the invention.

Referring to FIG. 9, an embodiment of a solar cell includes a semiconductor substrate 100 including a lower semiconductor layer 100a and an upper semiconductor layer 100b.

In an embodiment, the semiconductor substrate 100 may include a crystalline silicon or compound semiconductor. In such an embodiment, the crystalline silicon may be, for example, a silicon wafer. One of the lower semiconductor layer 100a and the upper semiconductor layer 100b is a semiconductor layer doped with a p-type impurity, and the other of the lower semiconductor layer 100a and the upper semiconductor layer 100b is a semiconductor layer doped with an n-type impurity. In one embodiment, for example, the lower semiconductor layer 100a may be a semiconductor layer doped with an n-type impurity, and the upper semiconductor layer 100b may be a semiconductor layer doped with a p-type impurity. In such an embodiment, the n-type impurity may be a group V compound such as phosphorus (P), for example, and the p-type impurity may be a group III compound such as boron (B), for example.

A silicon oxide layer 111 having a substantially thin thickness is disposed on the semiconductor substrate 100, e.g., on opposing surfaces of the semiconductor substrate 100. The silicon oxide layer 111 may be provided by being spontaneously oxidized on the semiconductor substrate 100, and may have a thickness of less than or equal to about 10 nm. In an alternative embodiment, the silicon oxide layer 111 may be omitted.

A plurality of transparent electrodes 120 may be disposed on the silicon oxide layer 111. The transparent electrodes 120 may have a substantially linear shape substantially parallel to a direction on the semiconductor substrate 100 or have a lattice shape on the front surface of the semiconductor substrate 100, but the invention is not limited thereto.

The transparent electrode 120 may include the transparent conductor including the metallic glass and the oxide glass, or the transparent conductor including a metallic glass grid, which are substantially the same as the embodiments of the transparent conductor described above. Accordingly, any repetitive detailed description of the transparent conductor of the transparent electrode 120 will hereinafter be omitted.

In such an embodiment, the transparent conductor of a transparent electrode 120 has a substantially high transparency and conductivity as described above such that the efficiency of the solar cell may be improved by increasing the light intensity absorbed in the front surface of the solar cell and simultaneously by increasing charge carrier mobility.

A front bus bar electrode (not shown) may be disposed on the transparent electrode 120. The front bus bar electrode of the solar cell may be connected to an adjacent solar cell during assembly of a plurality of solar cells.

In such an embodiment, as described above, the silicon oxide film 111 having a thin thickness is disposed under the semiconductor substrate 100. The silicon oxide film 111 may be provided by spontaneously oxidizing the semiconductor substrate 100, and has a thickness of less than or equal to about 20 nm. In one embodiment, for example, the silicon oxide film 111 may have a thickness less than or equal to about 10 nm. In an alternative embodiment, the silicon oxide film 111 may be omitted.

A rear electrode 140 is disposed under the silicon oxide film 111. The rear electrode 140 may include a conductive material, for example, an opaque metal such as aluminum (Al). The rear electrode 140 may be provided, e.g., formed, by a screen printing method using a conductive paste in the same manner as the front electrode 120.

In an embodiment, as described above, a transparent conductor including the metallic glass and the oxide glass, or a transparent conductor including a metallic glass grid is disposed only on the front surface of the solar cell, but the invention is not limited thereto. In an alternative embodiment, all electrodes of a solar cell may include a transparent conductor including the metallic glass and the oxide glass, or a transparent conductor including a metallic glass grid. In addition, an embodiment in which the transparent conductor is applied to a solar cell is described above, but the invention is not limited thereto. In another embodiment, and the transparent conductor may be used as an electrode for all electronic devices including a transparent electrode, e.g., as a pixel electrode and/or a common electrode of an LCD, an anode and/or a cathode of an OLED device, a display electrode of a plasma display panel, and the like.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A transparent electrode comprising a metallic glass and an oxide glass, the metallic glass being an alloy including a plurality of elements and having a glass transition temperature,
wherein
a transmittance of the transparent electrode is greater than or equal to about 85%, and
a specific resistance of the transparent electrode is less than or equal to about $10^{-3}$ ohm centimeter.

2. The transparent electrode of claim 1, wherein the transparent electrode comprises:
a matrix part comprising the oxide glass; and
a conductive network part comprising the metallic glass, wherein the conductive network part defines a network in the matrix part.

3. The transparent electrode of claim 2, wherein the conductive network part has a width less than a wavelength in a visible ray wavelength.

4. The transparent electrode of claim 3, wherein the conductive network part has a width in a range of about 0.1 nanometer to about 780 nanometers.

5. The transparent electrode of claim 1, wherein a content of the metallic glass in the transparent electrode is less than a content of the oxide glass in the transparent electrode.

6. The transparent electrode of claim 5, wherein the metallic glass in the transparent electrode is in a range of about 0.1 volume percent to about 15 volume percent based on a total volume of the transparent electrode.

7. A transparent electrode comprising a metallic glass grid comprising the metallic glass, the metallic glass being an alloy including a plurality of elements and having a glass transition temperature, wherein a transmittance of the transparent electrode is greater than or equal to about 85%, and a specific resistance of the transparent electrode is less than or equal to about $10^{-3}$ ohm centimeter.

8. The transparent electrode of claim 7, wherein
the metallic glass grid comprises:
a plurality of first metallic glass wires which extends in a first direction; and
a plurality of second metallic glass wires which extends in a second direction crossing the first direction, and
the first metallic glass wires and the second metallic glass wires are connected to each other at a plurality of junctions.

9. The transparent electrode of claim 7, wherein
the metallic glass grid is disposed on a surface of a substrate, and
the metallic glass grid has an area less than or equal to about 15% of a total area of the surface of the substrate.

10. The transparent electrode of claim 1, wherein the metallic glass comprises aluminum (Al), copper (Cu), zirconium (Zr), titanium (Ti), nickel (Ni), iron (Fe), gold (Au), magnesium (Mg), calcium (Ca), cerium (Ce), strontium (Sr), ytterbium (Yb), zinc (Zn), platinum (Pt), cobalt (Co), palladium (Pd), cerium (Ce), lanthanum (La), yttrium (Y), gadolinium (Gd), beryllium (Be), tantalum (Ta), gallium (Ga), hafnium (Hf), niobium (Nb), lead (Pb), platinum (Pt), silver (Ag), phosphorus (P), boron (B), silicon (Si), carbon (C), tin (Sn), zinc (Zn), lithium (Li), molybdenum (Mo), tungsten (W), manganese (Mn), erbium (Er), chromium (Cr), praseodymium (Pr), thulium (Tm), or a combination thereof.

11. An electronic device comprising:
the transparent electrode according to claim 1.

12. An electronic device comprising the transparent electrode according to claim 7.

* * * * *